United States Patent [19]

Lu et al.

[11] Patent Number: 5,231,052
[45] Date of Patent: Jul. 27, 1993

[54] PROCESS FOR FORMING A MULTILAYER POLYSILICON SEMICONDUCTOR ELECTRODE

[75] Inventors: Chih-Yuan Lu, Taipei; Hsiang-Ming Chou, Hsinchu, both of Taiwan

[73] Assignee: Industrial Technology Research Institute, Hsinchu, Taiwan

[21] Appl. No.: 655,123

[22] Filed: Feb. 14, 1991

[51] Int. Cl.$^5$ ............................................. H01L 21/283
[52] U.S. Cl. ................................... 437/190; 437/192; 437/193
[58] Field of Search ...................... 437/190, 192, 193; 357/59

[56] References Cited

U.S. PATENT DOCUMENTS

| | | | |
|---|---|---|---|
| 4,151,007 | 4/1979 | Levinstein et al. | 437/193 |
| 4,517,225 | 5/1985 | Broadbent | 437/194 |
| 4,774,204 | 9/1988 | Havemann | 437/193 |
| 4,800,177 | 1/1989 | Nakamae | 437/193 |
| 4,829,024 | 5/1989 | Klein et al. | 437/193 |
| 4,833,094 | 5/1989 | Kenney | 437/193 |
| 4,833,519 | 5/1989 | Kawano et al. | 437/193 |
| 4,873,204 | 10/1989 | Wong et al. | 437/56 |
| 4,977,108 | 12/1990 | Haskell | 437/193 |

FOREIGN PATENT DOCUMENTS 59-121829  7/1984 Japan .
01201913  8/1989 Japan .

OTHER PUBLICATIONS

"A High-Performance Sub-Half Micron CMOS Technology for Fast SRAMs", IEDM, 1989, pp. 417–420. CH26377/89/0000-0417.

Primary Examiner—Olik Chaudhuri
Assistant Examiner—David E. Graybill
Attorney, Agent, or Firm—George O. Saile

[57] ABSTRACT

A method for forming a multilayer contact to a device region through an insulating layered structure is described. An opening is formed through the insulating layered structure to the device region. A barrier metal layer is deposited over the device region and the insulating layered structure both above and on the sides of the opening. An in situ doped polysilicon layer is deposited over the barrier metal layer. A thin layer of metal is deposited over the polysilicon layer. The remaining portion of the opening is filled and the thin layer of metal is covered with undoped polysilicon. The undoped polysilicon is etched until the thin metal film is reached to thereby leave the opening filled. An aluminium metallurgical layer is deposited thereover to complete the multilayer contact.

12 Claims, 2 Drawing Sheets

PROCESS FOR FORMING A MULTILAYER POLYSILICON SEMICONDUCTOR ELECTRODE

BACKGROUND OF THE INVENTION (1) Field of the Invention

The invention relates to the manufacture of high density integrated circuits, and more particularly to the manufacture of electrical contacts to such integrated circuits.

(2) Description of the Prior Art

There continues to be a dramatic increase in the package density of integrated circuits. The feature size of these devices has reached one micrometer and is now approaching one half micrometer and below. The size of electrical contact windows are decreased with these decreasing feature sizes. However, the thickness of the dielectric through which these contact windows must pass cannot not be scaled down proportionally. The windows, therefore are now are small in the X-Y direction and large in the Z direction.

The usual technique is to fill these electrical contact windows with tungsten by a chemical vapor deposition method. However, this tungsten technique has many drawbacks from a practical manufacturing point of view. These include the difficulty and cost of the method, and the problems of tungsten contamination of the devices. Other metals have been proposed, but have caused similar problems.

A polysilicon plug for the electrical contact windows either with or without a barrier metal layer has been proposed. It does have the advantage of being easily deposited and adheres well to most materials. M. Kawano et al U.S. Pat. No. 4,833,519; J. L. Klein et al U.S. Pat. No. 4,829,024 and J. Hayden et al "A HIGH-PERFORMANCE SUB-HALF MICRON CMOS TECHNOLOGY FOR FAST SRAMS" Published in IEDM 89 pages 417-420, CH2637-7/89/0000-0417 1989 IEEE describe the use of such polysilicon plugs.

There are problems which must be overcome to make a manufacturable polysilicon plug process. Two major problems involve the conductivity of the polysilicon plug in the electrical contact windows and a successful etchback process. These are related problems to some extent. However, the etchback problem is the most serious in that the polysilicon plug can be partially removed when the polysilicon is etched back to the dielectric. When the dielectric is exposed there is what is termed a microloading effect which causes a greatly accelerated etching of the remaining polysilicon which is within the contact window. Of the three references mentioned in the previous paragraph, only the Klein et al U.S. Pat. No. 4,829,024 mentions and understands this problem. They use alternate layers of doped and undoped polysilicon and the desired endpoint of the etchback is detected by monitoring photoemissions provided from the reaction. A layer of polysilicon is maintained above the dielectric layer. In the above process, a very sophisticated endpoint scheme is required, this fact makes the manufacturing process much less feasible. Further, the use of low temperature deposited amorphous silicon instead of polycrystalline silicon is precluded, since no annealing step after polycrystalline silicon deposition is practiced.

SUMMARY OF THE INVENTION

Accordingly, it is a principal object of the invention to provide a manufacturable process for high density integrated circuits having small electrical contact windows filled with polysilicon plug and uses an etch stop layer to assure the coherence of the plug.

It is a further object of this invention to provide a manufacturable process that fills the small electrical contact windows with polysilicon, uses an etch stop to assure the coherence of the plug and has an anneal between about 700° to 800° C. to substantially improve the conductivity of the polysilicon plug.

In accordance with the present invention, a method for forming a multilayer contact to a device region through an insulating layered structure is described. An opening is formed through the insulating layered structure to the device region. A barrier metal layer is deposited over the device region and the insulating layered structure both above and on the sides of the opening. An in situ doped polysilicon layer is deposited over the barrier metal layer. A thin layer of metal is deposited over the polysilicon layer. The remaining portions of the opening is filled and the thin layer of metal is covered over with undoped polysilicon. The undoped polysilicon is etched until the thin metal film is reached to thereby leave the opening filled. An aluminium metallurgical layer is deposited thereover to complete the multilayer contact.

A variation on this process is to form a multilayer contact to a device region through an insulating layered structure without using the thin layer of metal. An opening is formed through the insulating layered structure to the device region. A barrier metal layer is deposited over the device region and the insulating layered structure both above and on the sides of the opening. An in situ doped polysilicon layer is deposited over the barrier metal layer. The remaining portions of the opening is filled and over the in situ doped polysilicon layer with undoped polysilicon. The undoped polysilicon layer is etched until the in-situ doped layer is reached to thereby leave the opening filled. An aluminium metallurgical layer is formed thereover to complete multilayer contact.

A further improvement in the conductivity of the contact is made by after etching of the undoped polysilicon layer, an anneal of the structure between 700° and 800° C. is done.

DESCRIPTION OF THE PREFERRED EMBODIMENTS

Figure 1:
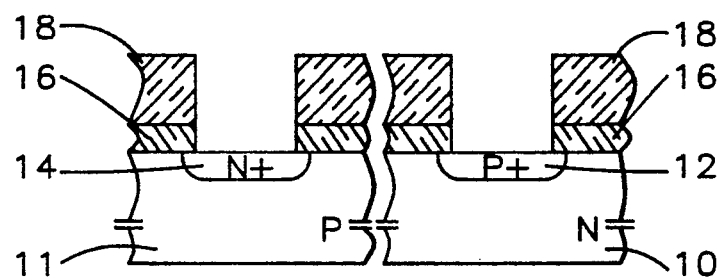
FIGS. 1 through 4 schematically illustrate in cross-section the fabrication of the electrical contact structure of the present invention.

Referring now more particularly to FIG. 1 there is shown a schematic cross-sectional representation of the present invention at an early stage of manufacture. The product under manufacture can be either an N-channel MOSFET, a P-channel MOSFET or a CMOS FET. However, the FIGS. 1 through 4 process is intended to schematically intended to show a CMOS FET process that makes a electrical contact to both P+ and N+ source/drain regions. The substrate 10, 11 is monocrystalline silicon and has been doped by conventional techniques to either P or N as is appropriate for the desired N-channel or P-channel MOS FET structure. A break is shown in the drawings to show the separation between what is typically a P well region and an N well region in the substrate. An example of such a conventional process is described in the book "VLSI TECHNOLOGY" Second Edition by S. M. Sze Published by McGraw-Hill Book Co., New York, N.Y. 1988 Pages 485–487.

Source/drain regions 12 and 14 are formed by conventional methods as described, for example by Sze cited above in the appropriate wells of substrate 10, 11. An insulating layered structure composed of a layer of silicon dioxide 16 and a much thicker layer of borophosphosilicate glass, phosphosilicate glass or similar insulating layer 18. The operational thicknesses of these layers are between about 1000 to 2000 Angstroms for the oxide layer and between about 4000 to 10,000 or more Angstroms for the glasseous layer. These layers are typically deposited by chemical vapor deposition in low pressure or atmospheric pressure, or in a plasma enhance reactive chamber.

The contact windows or openings are now formed through the insulating layered structure to the source/drain regions 12 and 14 in the device regions. This process step is conventionally done by lithography and etching techniques which preferably use a reactive ion etching process that will anisotropically etch both components of the layered structure 16, 18. A typical reactive ion etching process using fluorine containing etching chemical species. These oxide/glass layers etching processes are well known to those in the art. The size of the contact window opening can be as small as limitation of the etching and lithography patterning capability. This completes the FIG. 1 structure.

Figure 2:
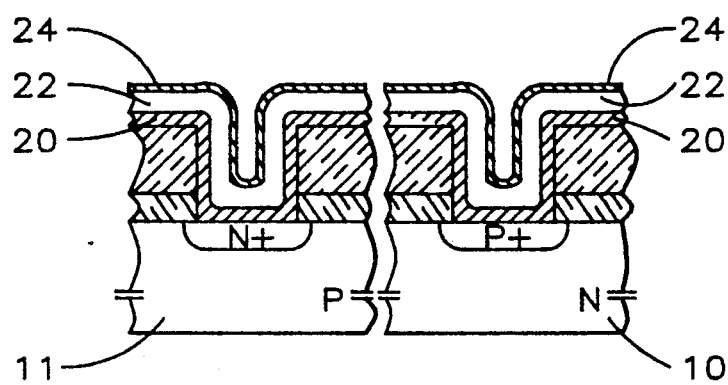

As shown in FIG. 2, a barrier metal layer 20 is deposited over the exposed device region and the insulating layered structure both above and on the sides of the opening. This layer may be deposited by, for example chemical vapor deposition or sputtering. The operational thickness is between about 200 to 2000 Angstroms and the preferred thickness is between about 200 to 1500 Angstroms. The thickness of this layer 20 is dependant upon the height and profile of the contact hole. The formula for this thickness relationship is 0.07 X to 0.15 X where X is the contact opening size. The preferred metal used is either TiW or TiN. An in situ doped polysilicon layer 22 is now deposited over the barrier metal layer 20. The operational thickness of this layer is between about 300 to 3000 Angstroms and the preferred thickness is between about 600 to 2500 Angstroms. The thickness of this layer is dependent upon the opening size, for example if the opening is 0.5 micrometers, the polysilicon layer 22 may be 1000 Angstroms. The formula for this thickness relationship is 0.15 to 0.25 X micrometers = the polysilicon layer thickness, where X = the opening or contact size. A thin layer of metal 24 is deposited over the layer 22. The operational thickness of this layer is between about 100 to 600 Angstroms and the preferred thickness is between about 200 to 400 Angstroms. The composition of thin layer is composed of the group consisting of titanium, molybdenum, copper, titanium nitride, titanium-tungsten, titanium silicide, tungsten silicide, cobalt silicide, molybdenum silicide, platinum silicide, aluminum, tungsten, etc. This completes FIG. 2 structure.

Undoped polysilicon 28 is now deposited to a thickness of between about 1000 to 5000 Angstroms. The principal reason to use undoped polysilicon is that the step coverage of undoped polysilicon is much better than doped polysilicon at the present state of technology. If a process becomes available which produces better step coverage of doped polysilicon, doped polysilicon deposition would be preferred over undoped polysilicon. The process for depositing the undoped polysilicon is either low pressure or atmospheric chemical vapor deposition from silane. However, the low pressure alternative is preferred.

Figure 3:
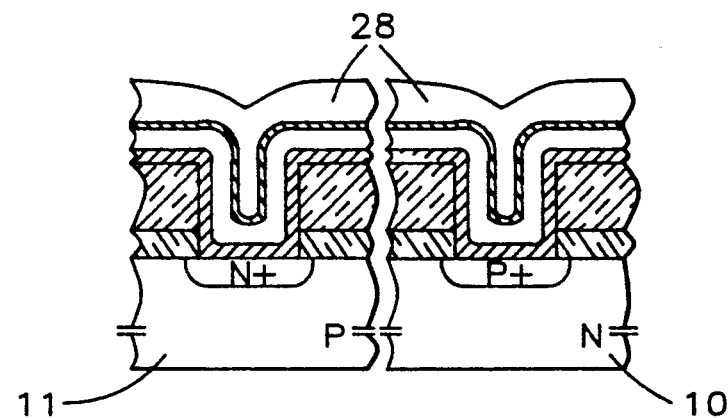

The result of this process is to fill the openings or contact windows and cover the surface portions of the layers 20, 22, and 24. Therefore, the thickness of layer 28 has to be larger than 0.15 X to 0.30 X where X is the contact opening size such that the opening can be completely filled. The undoped polysilicon is used to give the desired excellent step-coverage. FIG. 3 shows the result of this process.

Figure 4:
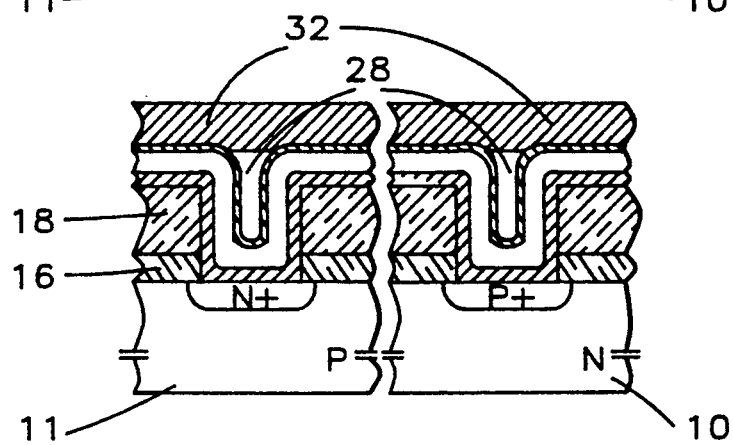

Polysilicon etchback is now accomplished by reactive ion etching using well known reactive gases, such as Chlorine, Fluorine, etc. as the active specie. Reactive ion etching is preferred to be used, since it gives high selectivity to layer 24. This can easily be achieved, because isotropic plasma mode etching can be used. The process may be stopped when the thin metal film 24 is reached. The endpoint of this process is achieved by a common silicon species monitoring endpoint technique which is known by those in the art. The metal film 24 serves as an etching stop such that the etching can be easily controlled to stop on the top of the in-situ doped polysilicon layer 20. Alternatively, the thin metal film 24 can be a sacrificial layer for the polysilicon etchback. This overetching will only take this thin film 24 away without attacking the underlying in-situ doped polysilicon. This preferred overetching is done is an isotropic plasma mode reactor process which removes all polysilicon outside contact areas. The undoped polysilicon 28 is now fully removed away except for that material plugged into the contact hole as seen in FIG. 4.

The next step is to anneal the structure at a temperature between about 600° to 900° C. and preferably between about 700° to 800° C. An experiment following the aforementioned procedure has been done using the process described above and this critical step has been found to significantly improve the conductivity of the multilayer contact. The results of such an improvement in shown in FIG. 5. The preferable operating temperature sufficiently activates the polysilicon without deteriorating the metal to silicon contact.

The final steps are to deposit Aluminium, Aluminium Silicon, Aluminium Silicon Copper, or the like electrical conductor 32 removed by conventional chemical vapor deposition, sputtering or the like. The Aluminium/TiW/doped polysilicon/TiW layer is now patterned by conventional lithography and reactive ion etching techniques to complete the structure.

Figure 5:
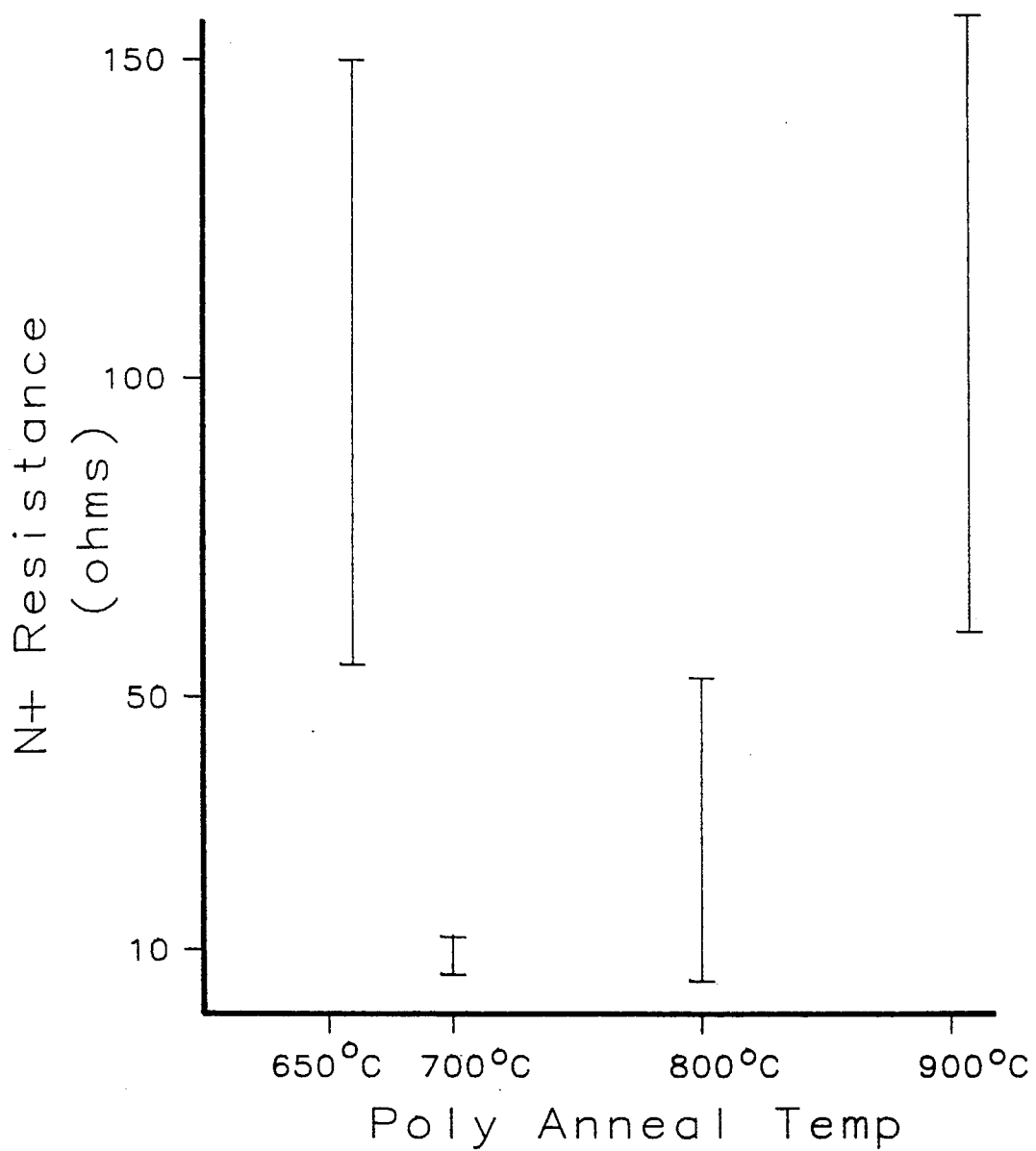
FIG. 5 is a graphical representation showing the improved results in the electrical contact of the present invention by use of an annealing process.

A variation to the process described above is to not use the thin metal layer 24. All other processing is identical, including the critical FIG. 5 illustrated annealing process. It is preferred to stop the etchback of the undoped polysilicon layer 28 slightly before the doped polysilicon layer is reached to avoid the loading effect on the polysilicon layer which very quickly attacks the undoped polysilicon in the opening or contact window. While the structure without an etchstop offers simpler conductor structure, an etchstop process renders more critical control over the process during the manufacturing process.

While the invention has been particularly shown and described with reference to the preferred embodiments thereof, it will be understood by those skilled in the art that various changes in form and details may be made without departing from the spirit and scope of the invention.

What is claimed is:

1. A method for forming a multilayer contact to a device region through an insulating layered structure comprising:

forming an opening through said insulating layered structure to said device region;

depositing a barrier metal layer over said device region and the said insulating layered structure both above and on the sides of said opening;

depositing a conductivity doped polysilicon layer over said barrier metal layer so that the barrier metal is covered and a portion of the opening remains unfilled;

depositing a thin layer of metal over said polysilicon layer;

filling the remaining portions of said opening and over said thin layer of metal with undoped polysilicon;

etching said undoped polysilicon until said thin layer of metal outside of said opening is reached to thereby leave the said opening filled with undoped polysilicon; and depositing an aluminium layer thereover to complete said multilayer contact.

2. The method of claim 1 wherein after etching of said undoped polysilicon layer, an anneal of between 700° and 800° C. is done to improve the conductivity in the resulting said multilayer contact.

3. The method of claim 1 wherein said thin layer of metal has a thickness of between about 200 to 400 Angstroms.

4. The method of claim 3 wherein said etching is stopped after the said thin layer of metal is completely removed.

5. The method of claim 3 wherein said thin layer of metal is composed of titanium-tungsten.

6. The method of claim 3 wherein said thin layer of metal is composed of titanium nitride.

7. The method of claim 3 wherein said etching is by reactive ion etching under the conditions that silicon specie components are in the chamber and an endpoint between polysilicon and the said thin metal film is detected.

8. The method of claim 1 wherein said doped polysilicon layer is 0.15 X to 0.25 X micrometers, where X equals said opening dimension.

9. The method of claim 8 wherein said opening dimension is less than about 0.5 micrometers, said barrier layer is between about 300 to 800 Angstroms thick, and said undoped polysilicon layer is between about 1000 to 5000 Angstroms thick before etching.

10. The method of claim 1 wherein said barrier layer is composed of titanium nitride.

11. The method of claim 1 wherein said barrier layer is composed of titanium-tungsten.

12. A method for forming a multilayer contact to a device region through an insulating layered structure comprising:

forming an opening through said insulating layered structure to said device region;

depositing a barrier metal layer over said device region and the said insulating layered structure both above and on the sides of said opening;

depositing a conductivity doped polysilicon layer over said barrier metal layer so that the barrier metal is covered and a portion of the opening remains unfilled; depositing a thin layer of metal over said polysilicon layer;

filling the remaining portions of said opening and over said thin layer of metal with undoped polysilicon; etching said undoped polysilicon until said thin metal film layer of outside of said opening is reached to thereby leave the said opening filled with undoped polysilicon;

annealing between about 600° to 900° C. to improve the conductivity in the multilayer contact; and depositing an aluminium layer thereover to complete said multilayer contact.

* * * * *